(12) United States Patent
Huesken et al.

(10) Patent No.: US 9,490,354 B2
(45) Date of Patent: Nov. 8, 2016

(54) INSULATED GATE BIPOLAR TRANSISTOR

(71) Applicant: Infineon Technologies AG, Neubiberg (DE)

(72) Inventors: Holger Huesken, Munich (DE); Frank Dieter Pfirsch, Munich (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/260,490

(22) Filed: Apr. 24, 2014

(65) Prior Publication Data

US 2014/0319578 A1    Oct. 30, 2014

(30) Foreign Application Priority Data

Apr. 26, 2013    (CN) .................... 2013 2 0220731 U

(51) Int. Cl.
| | | |
|---|---|---|
| *H01L 29/739* | (2006.01) | |
| *H01L 29/36* | (2006.01) | |
| *H01L 29/78* | (2006.01) | |
| *H01L 21/265* | (2006.01) | |
| *H01L 21/22* | (2006.01) | |
| *H01L 29/06* | (2006.01) | |
| *H01L 29/08* | (2006.01) | |
| *H01L 29/423* | (2006.01) | |
| *H01L 29/66* | (2006.01) | |
| *H01L 29/10* | (2006.01) | |
| *H01L 29/167* | (2006.01) | |
| *H01L 21/331* | (2006.01) | |

(52) U.S. Cl.
CPC ........... *H01L 29/7397* (2013.01); *H01L 21/22* (2013.01); *H01L 21/26513* (2013.01); *H01L 29/0623* (2013.01); *H01L 29/0834* (2013.01); *H01L 29/1095* (2013.01); *H01L 29/167* (2013.01); *H01L 29/36* (2013.01); *H01L 29/4236* (2013.01); *H01L 29/66348* (2013.01)

(58) Field of Classification Search
CPC ........... H01L 29/7395; H01L 29/7393; H01L 29/66333; H01L 29/7397
See application file for complete search history.

(56) References Cited

U.S. PATENT DOCUMENTS

| | | | |
|---|---|---|---|
| 6,239,466 B1 * | 5/2001 | Elasser et al. ................. 257/341 |
| 2005/0161746 A1 * | 7/2005 | Mauder ............... H01L 29/0834 | |
| | | | 257/370 |
| 2006/0035436 A1 * | 2/2006 | Schulze ................ H01L 21/223 | |
| | | | 438/345 |
| 2008/0054369 A1 * | 3/2008 | Schulze et al. ............... 257/378 |
| 2008/0179666 A1 * | 7/2008 | Foerster ................ H01L 29/407 | |
| | | | 257/330 |
| 2008/0283868 A1 * | 11/2008 | Schulze .............. H01L 27/0761 | |
| | | | 257/174 |

(Continued)

*Primary Examiner* — Victor A Mandala
*Assistant Examiner* — Regan J Rundio
(74) *Attorney, Agent, or Firm* — Murphy, Bilak & Homiller, PLLC

(57) ABSTRACT

A semiconductor body of an IGBT includes: a first base region of a second conductivity type; a source region of a first conductivity type different from the second conductivity type and forming a first pn-junction with the first base region; a drift region of the first conductivity type and forming a second pn-junction with the first base region; a collector region of the second conductivity type; at least one trench filled with a gate electrode and having a first trench portion of a first width and a second trench portion of a second width, the second width being different from the first width; and a field stop region having the first conductivity type and located between the drift region and the collector region. The field stop region includes a plurality of buried regions having the second conductivity type.

9 Claims, 5 Drawing Sheets

(56) References Cited

U.S. PATENT DOCUMENTS

2012/0068220 A1\* 3/2012 Kobayashi et al. .......... 257/124

2013/0234201 A1\* 9/2013 Xiao ................... H01L 29/7393
                                                                257/139

\* cited by examiner

US 9,490,354 B2

INSULATED GATE BIPOLAR TRANSISTOR

PRIORITY CLAIM

This application claims priority to CN Utility Model Application No. 201320220731.8, filed on 26 Apr. 2013, the content of said CN Utility Model Application incorporated herein by reference in its entirety.

TECHNICAL FIELD

The present application relates to a semiconductor device, more particularly, relates to an insulated gate bipolar transistor.

BACKGROUND

Insulated gate bipolar transistors (IGBT) are semiconductor devices composited by metal-oxide-semiconductor field-effect transistor (MOSFET) and bipolar junction transistor (BJT), and thus possess advantages of the two kinds of devices, viz. low driving power and fast switching speed of MOSFET, reduction of saturation pressure and large capacity of BJT as well. Thus, IGBTs are recently widely applied to fields requiring power conversion, such as AC machines, transducers, switching power supplies, lighting circuits, traction drives etc.

FIG. 1 shows an example of an existing IGBT. As shown in FIG. 1, the IGBT 10 is shown to have a trench gate field stop structure, which comprises a p-type collector region 11, an n-type field stop region 12, an n$^-$-type drift region 13, a p-type base region 14 and an n$^+$-type source region 15 laminated successively, and a gate 16 and a gate oxide layer 17 formed in the n$^-$-type drift region 13, the p-type base region 14 and the n$^+$-type source region 15.

Furthermore, in the IGBT 10 shown in FIG. 1, the gate 16 includes an upper gate 161 having a uniform section width and a lower gate 162 having a section width larger than that of the upper gate 161. Such a structure is called as partially narrow mesa (PNM) structure. An IGBT having a similar structure is disclosed in the essay *Low Loss IGBT with Partially Narrow Mesa Structure (PNM-IGBT)* published by Masakiyo Sumitomo et al. at the 24$^{th}$ International Symposium on Power Semiconductor Devices and IC (ISPSD) in 2012 and in the U.S. Pat. No. 7,800,187B2. Mesa width (width of a base region between two adjacent trench gates) can be reduced without reducing metal-semiconductor contact area by forming a partially narrow mesa structure (narrowing the base region between two adjacent trench gates) as shown by the dotted box in FIG. 1, so that the saturation voltage of the IGBT 10 is significantly reduced, and a good balance between on-state voltage and turn-off loss is obtained.

However, in case of an extremely small mesa structure on the front side of an insulated gate bipolar transistor, there is a high concentration of free charge carriers in the on-state of the device close to the front side of the transistor to obtain low saturation voltage values $V_{CEsat}$. Therefore, it is necessary to reduce the emitter efficiency of the backside emitter of the insulated gate bipolar transistor to reduce power losses occurring during turn-off of the insulated gate bipolar transistor. On the other hand, a soft turn-off behavior of the insulated gate bipolar transistor is required to avoid high voltage peaks during turn-off, in particular for the case of high stray inductances. Furthermore, for a good short-circuit robustness, the emitter efficiency should not be too low at room temperature or at even lower operation temperatures to avoid or at least reduce a detrimental "Umklapp"-effect of the vertical distribution of the electrical field (also known as Kirk-effect).

SUMMARY

An IGBT device is provided which is capable of reducing power losses during turn-off and simultaneously assuring a good short-circuit robustness for operation at low temperatures can be provided.

According to an embodiment, an insulated gate bipolar transistor comprising a semiconductor body is provided. The semiconductor body comprises: a first base region having a second conductivity type; a source region having a first conductivity type different from the second conductivity type and forming a first pn-junction with the first base region; a drift region having a first conductivity type different from the second conductivity type and forming a second pn-junction with the first base region; a collector region having a second conductivity type that is different from the first conductivity type; at least one trench, wherein the at least one trench is filled with a gate electrode and wherein the at least one trench has a first trench portion having a first width and a second trench portion having second width, the second width being different from the first width; and a field stop region which has the first conductivity type and is located between the drift region and the collector region, wherein the field stop region includes a plurality of buried regions having the second conductivity type.

The at least one buried region can comprise a plurality of buried local p-type regions that are displaced in a lateral direction of the insulated gate bipolar transistor with respect to each other.

The at least one buried region can comprise a plurality of buried local p-type regions having a lateral extension that covers several cell pitches.

At least one buried region can be aligned to the front side structure of the insulated gate bipolar transistor.

The field stop region can include a proton implantation region.

The collector region can include: a first collector zone having a first doping concentration; and a second collector zone having a second doping concentration, wherein the first collector zone and the second collector zone are arranged laterally, and the first doping concentration is different from the second doping concentration.

The field stop region can include a deep level first conductivity type doped region.

The deep level first conductivity type doped region can comprise a level of at least 0.2 eV below the conduction band edge.

The deep level first conductivity doped region can comprise at least one type of atoms which having deep levels in the energy band gap of silicon.

The deep levels in the energy band gap of silicon can be at least 0.2 eV below the closest band edge of silicon.

At least one type of atoms can include at least one from selenium and sulphur.

The concentration of the at least one type of atoms can be 1. E+16 cm$^{-3}$ or more.

The deep level first conductivity type doped region can include: a first region having a first deep level atom doping concentration; and a second region that is closer to the third pn-junction between the collector region and the field stop region than the first region and has a second deep level atom doping concentration, wherein the second deep level atom doping concentration is larger than the first deep level atom doping concentration.

The field stop region can further include atoms with energy levels which are close to the nearest band edge of silicon.

The insulated gate bipolar transistor can further comprise a groove formed on a surface of the semiconductor body and arranged at least partially at the source region, and wherein the groove is filled with a part of tan emitter electrode such that the emitter electrode is in contact with the source region and the first base region The depth of the groove can be larger than or equal to the depth of the first pn-junction formed by the source region and the first base region.

The insulated gate bipolar transistor can further comprise an anti-latch-up region (P+) formed in the first base region, having the first conductivity type and a doping concentration larger than that of the first base region.

The anti-latch-up region (P+) can have at least one first portion located below and contacting the source region (55)

The second trench portion can be arranged below the first trench portion (561) in a vertical direction of the insulated gate bipolar transistor and wherein the second width is larger than the first width in a lateral direction of the insulated gate bipolar transistor.

The first width of the first trench portion can be a uniform width along the first trench portion.

At least one trench can comprise an insulation electrically insulating the gate electrode (56) from at least the source region and the first base region In the insulated gate bipolar transistor according to embodiments, as the field stop region includes the deep level doped region, as to low temperature operations, the deep level doping atoms in the deep level doped region have a relatively low activation in a non-depleted layer of the field stop region, so that the emitter efficiency can be chosen relatively high at lower temperatures; while compared to higher operation temperatures, the emitter efficiency is usually significantly lower at lower temperatures, so that a good short-circuit robustness can be obtained while assuring the reduction of power losses during turn-off at higher operation temperatures of the insulated gate bipolar transistor. Furthermore, the leakage current of this device can be minimized by this measure.

Those skilled in the art will recognize additional features and advantages upon reading the following detailed description, and upon viewing the accompanying drawings.

BRIEF DESCRIPTION OF THE DRAWINGS

The principles of the invention will be explained by way of example below with the aid of exemplary embodiments with reference to the appended figures. In the figures, unless otherwise indicated, references which are the same denote elements which are the same or elements which have the same function or an equivalent function.

DETAILED DESCRIPTION

The following detailed description refers to the accompanying drawings that show, by way of illustration, specific details and embodiments in which the present invention may be practiced.

The word "over" used with regards to a material formed "over" a side or surface, may be used herein to mean that the material may be formed "directly on", e.g. in direct contact with, the implied side or surface. The word "over" used with regards to a material formed "over" a side or surface, may be used herein to mean that the material may be formed "indirectly on" the implied side or surface with one or more additional layers being arranged between the implied side or surface and said material.

Special field stop structures can be used to guarantee a soft turn-off behavior and good short-circuit robustness at relatively low operation temperatures (e.g. at room temperature or even lower temperatures) for the case of a relatively low emitter efficiency of the backside p-emitter of an IGBT with a narrow mesa-structure at higher operation temperatures.

Figure 1:
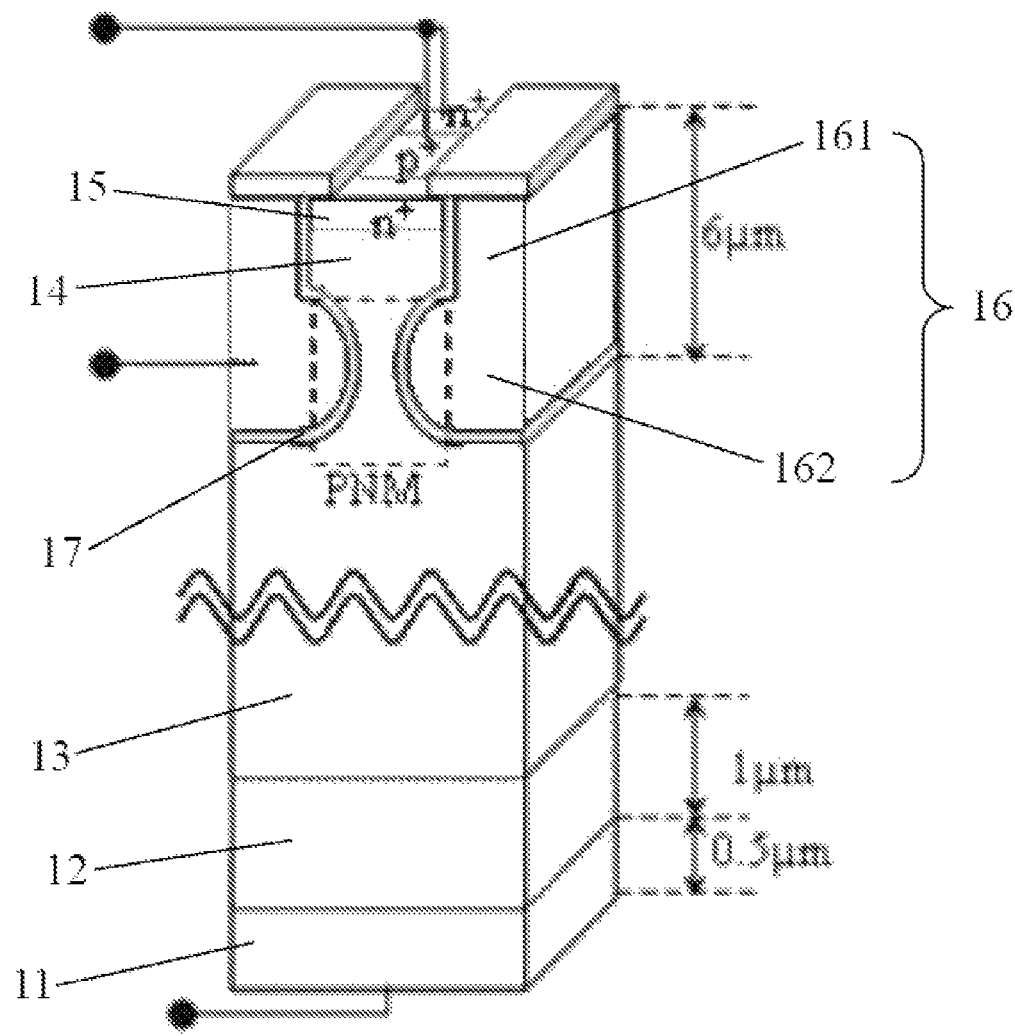
FIG. 1 is an oblique view showing an example of an existing IGBT.
Figure 2:
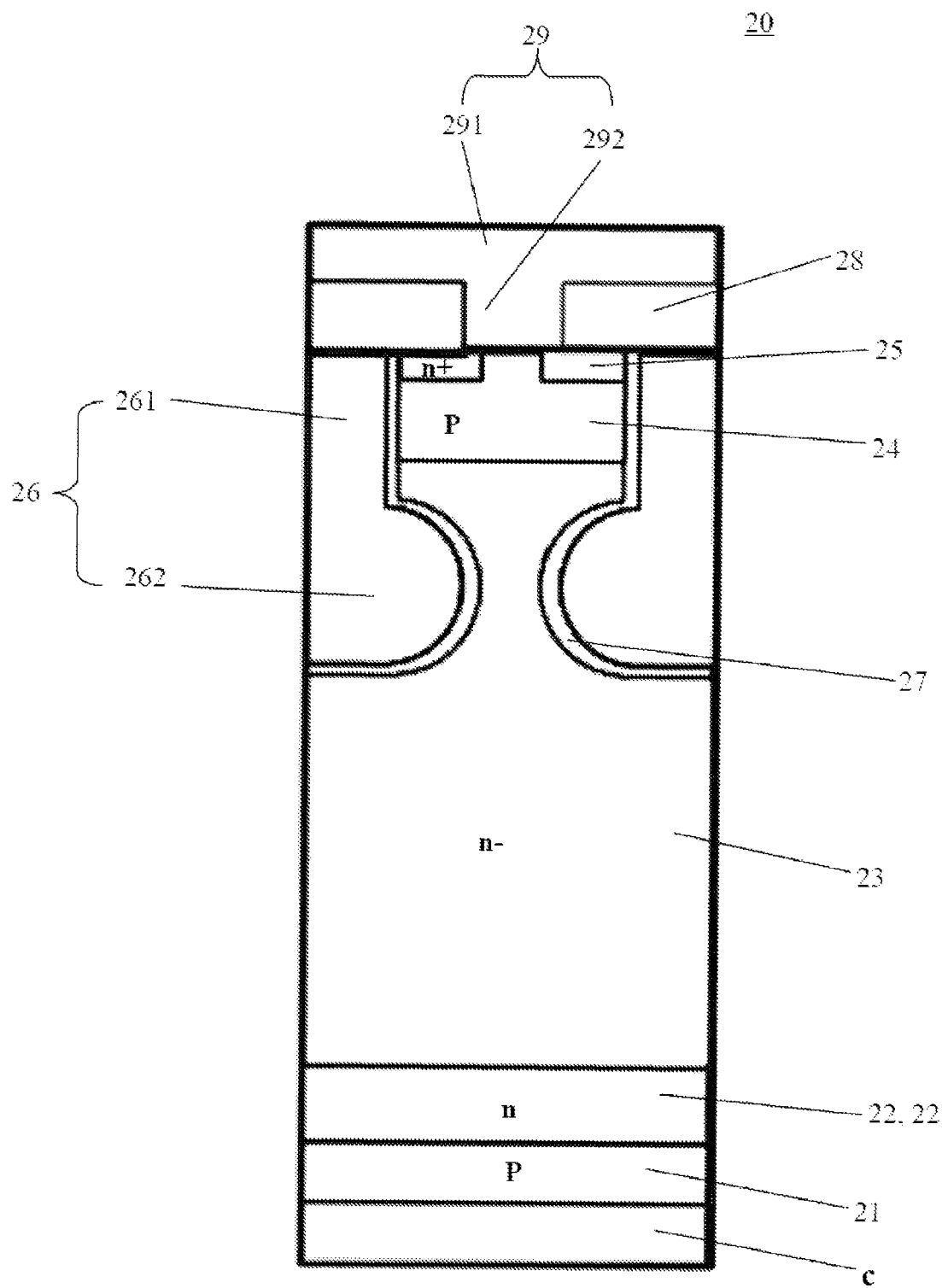
FIG. 2 is a sectional view showing an IGBT according to an embodiment.

FIG. 2 is a sectional view showing an IGBT according to an embodiment. With reference to FIG. 2, the IGBT 20 is shown to comprise a collector C, a p-type collector region 21, an n-type field stop region 22, an n$^-$-type drift region 23, a p-type base region 24 and an n$^+$-type source region 25 laminated successively, and a gate 26 and a gate dielectric layer 27 formed in the n$^-$-type drift region 23, the p-type base region 24 and the n$^+$-type source region 25. The gate dielectric layer 27 insulates the gate electrode 26 from at least the source region 25 and the base region 24. Moreover, an interlayer dielectric layer 28 is formed on the upper surfaces of the p-type base region 24, the n$^+$-type source region 25 and the gate 26. The IGBT 20 further has an emitter 29, which includes a first emitter part 291 and a second emitter part 292. The first emitter part 291 is formed on the interlayer dielectric layer 28, while the second emitter part 292 extends downwards from the lower surface of the first emitter part 291 through the interlayer dielectric layer 28, so as to be in contact with the p-type base region 24 and the n$^+$-type source region 25.

Furthermore, in the IGBT 20 shown in FIG. 2, the gate 26 includes an upper gate 261 having a uniform section width and a lower gate 262 having a section width larger than that of the upper gate 261. The width of the upper gate 261 is uniform along the upper gate 261.

A groove is formed on a surface of the semiconductor body and arranged at least partially at the source region 25, and wherein the groove is filled with a part of tan emitter electrode such that the emitter electrode is in contact with the source region and the base region 24. The depth of the groove is larger than or equal to the depth of the pn-junction formed by the source region 25 and the base region 24. An anti-latch-up region (P+) having a doping concentration larger than that of the base region 24 is formed in the base region 24, the anti-latch-up region (P+) has at least one first portion located below and contacting the source region 25.

In the IGBT according to an embodiment as shown in FIG. 2, the n-type field stop region 22 includes a deep level doped region 22' that is doped with at least one type of atoms which have deep levels in the energy band gap of silicon. In this context, deep level doped region means that at least one of the energy levels in the band gap of the doping atoms has a difference to the nearest band edge of at least 150 meV, preferably at least 200 meV below the nearest band edge. The deep levels in the energy band gap of silicon are at least 0.2 eV below the closest band edge of silicon. Examples for such atoms with deep levels include for example selenium (Se) or sulphur (S), while not being limited to the two kinds of atoms. The atoms both exhibit two deep levels in the energy band gap of silicon. The advantage of these deep levels is, that for low operation temperatures the activation of these atoms in the non-depleted region of the n-type field stop region 22 is relatively low (resulting in a relatively high transport factor), so that the emitter efficiency of the IGBT can be chosen relatively high at lower temperatures. In particular, at room temperature, a soft turn-off behavior is a critical point, because at lower temperatures, the emitter efficiency of the IGBT is usually significantly lower compared to higher operation temperatures. In other words, the IGBT is enabled to have a relatively soft turn-off behavior and a good short-circuit robustness at low temperatures in combination with not too high turn-off losses at higher temperatures by arranging a field stop region between the drift region and the collector region of the IGBT, wherein said field stop region includes a deep level doped region being doped with atoms which have deep levels in the energy band gap of silicon. Furthermore, the leakage current at high temperatures of the IGBT can be significantly reduced by using such a deep level doped region. Furthermore, the n-type field stop region 22 may further include atoms with energy levels which are close to the nearest band edge of silicon. The deep level doped region 22' comprises a level of at least 0.2 eV below the conduction band edge.

Preferably, a relatively high concentration of the atoms as deep level donors at least close to the pn-junction between the p-type collector region and the field stop region is expected. The reason for the preferred high doping level is that the higher the doping level, the stronger is the temperature dependence of the activation of these doping atoms and the smaller is the temperature dependence of the backside emitter efficiency (it can be even negative). Therefore, it is expected that doping concentrations, in particular close to the pn-junction between the field stop region and the p-type collector region of the IGBT, exceed preferentially 1. E+16 $cm^{-3}$. Doping levels exceeding 1. E+15 $cm^{-3}$ are also possible. The doping level of the p-type collector region has to be adapted to the enhanced field stop concentration.

In certain areas of the IGBT where a low concentration of free charge carriers in the on-state of the IGBT is useful over the whole operation temperature range (like e.g. in the area of the junction termination or below the gate pad or gate leads), the doping concentration of the field stop region could be even higher; furthermore, in these areas, it could be advantageous, if the field stop region additionally or alternatively contains atoms with energy levels which are relatively close to the conduction band edge of silicon to reduce the injection of free charge carriers in these areas for the whole operation temperature range.

As specific examples for optimizing the soft turn-off behavior of the IGBT, selenium (Se) and sulphur (S) can be incorporated in two ways into the deep level doped region of the n-type field stop region 22 through in-diffusion techniques or ion beam implantation with a subsequent drive-in step, while not being limited to the above doping methods.

Figure 3:
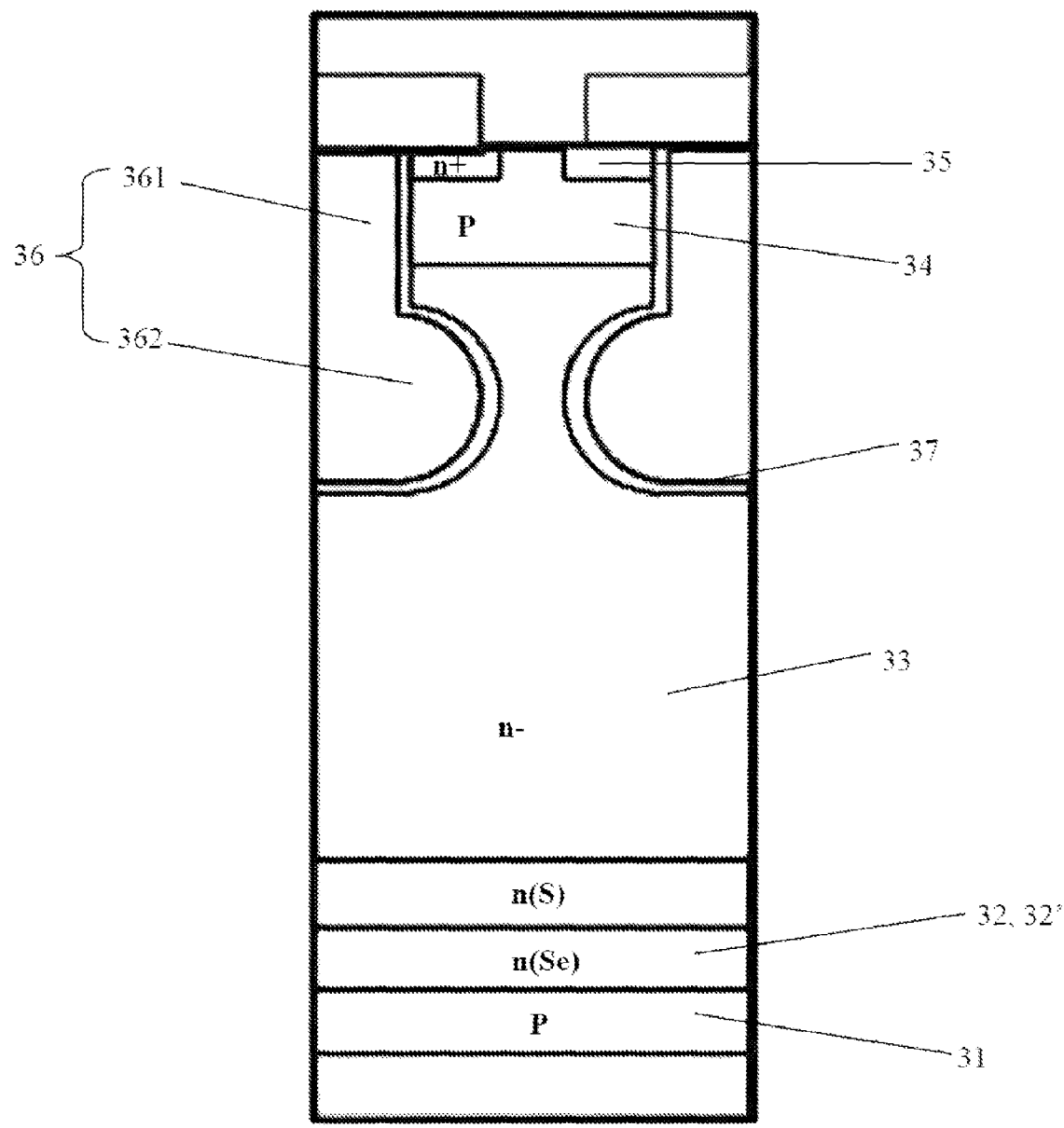
FIG. 3 is a sectional view showing an IGBT according to an embodiment which has Se and S doped in two steps in a deep level doped region.
Figure 4:
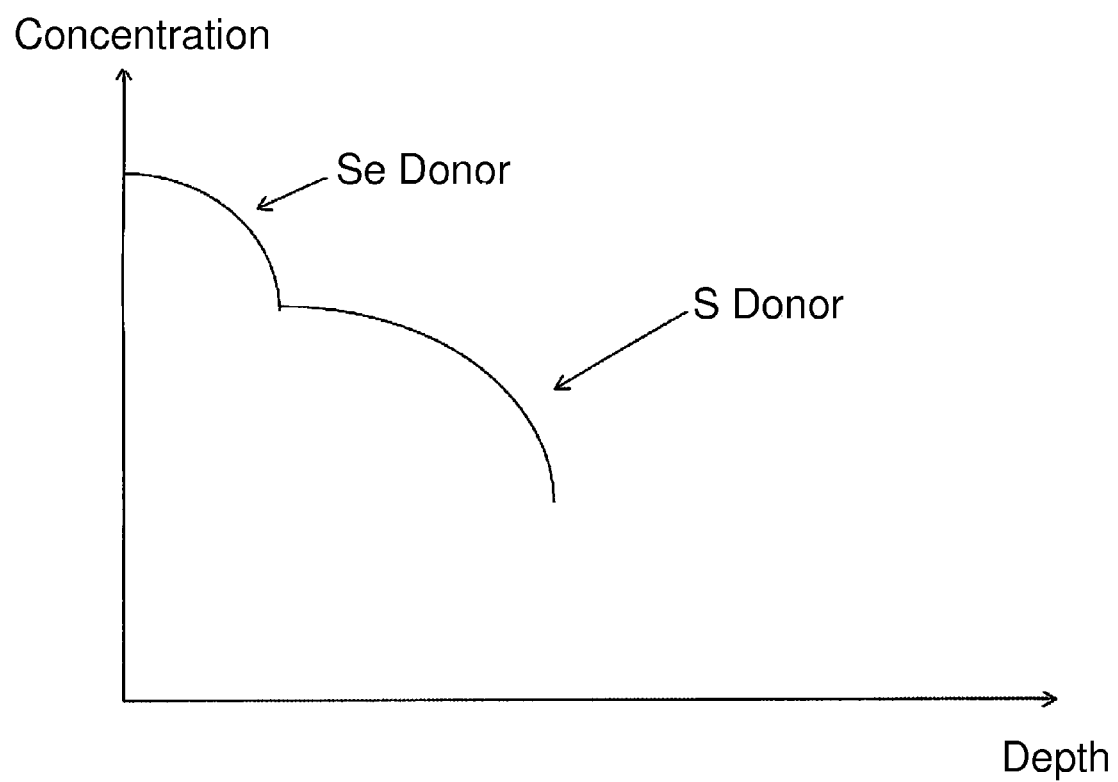
FIG. 4 is a drawing showing a schematic Se+S-field stop doping profile according to an embodiment.

FIG. 3 shows a sectional view of an IGBT according to an embodiment, which has Se and S doped with two different penetration depths in the deep level doped region, wherein the reference signs (31, 32, 32', 33, 34, 35, 36, 37, 361, 362) similar to that in FIG. 2 correspond to corresponding parts (21, 22, 22', 23, 24, 25, 26, 27, 261, 262) in FIG. 2, and the specific references thereof are not particularly described any more. FIG. 4 shows a schematic Se+S-field stop doping profile according to an embodiment, wherein the horizontal axis corresponds to a vertical cut (depth) through the IGBT from the backside of the IGBT (left) in the direction to the frontside, while the vertical axis represents the concentrations of doping atoms.

It can be seen from FIG. 4 that the penetration depth of sulphur is usually higher compared to the penetration depth of selenium, and the concentration of sulphur is therefore lower, so that a two-step doping profile is formed in the IGBT. The targeted two-step doping profile can be achieved either by a two-step diffusion of both dopants. Alternatively a simultaneous in-diffusion is possible, because the diffusion coefficient of sulphur is much higher compared to the diffusion coefficient of selenium. Due to the reduced speed of penetration of the space charge layer during turn-off of the IGBT, the resulted two-step doping profile enables the IGBT to have an extremely soft turn-off behavior. Furthermore, the short-circuit robustness can be significantly enhanced by such a two-step doping profile due to a very efficient partial compensation of the electron current flowing during short circuit resulting in a reduction of the Kirk effect.

Figure 5:
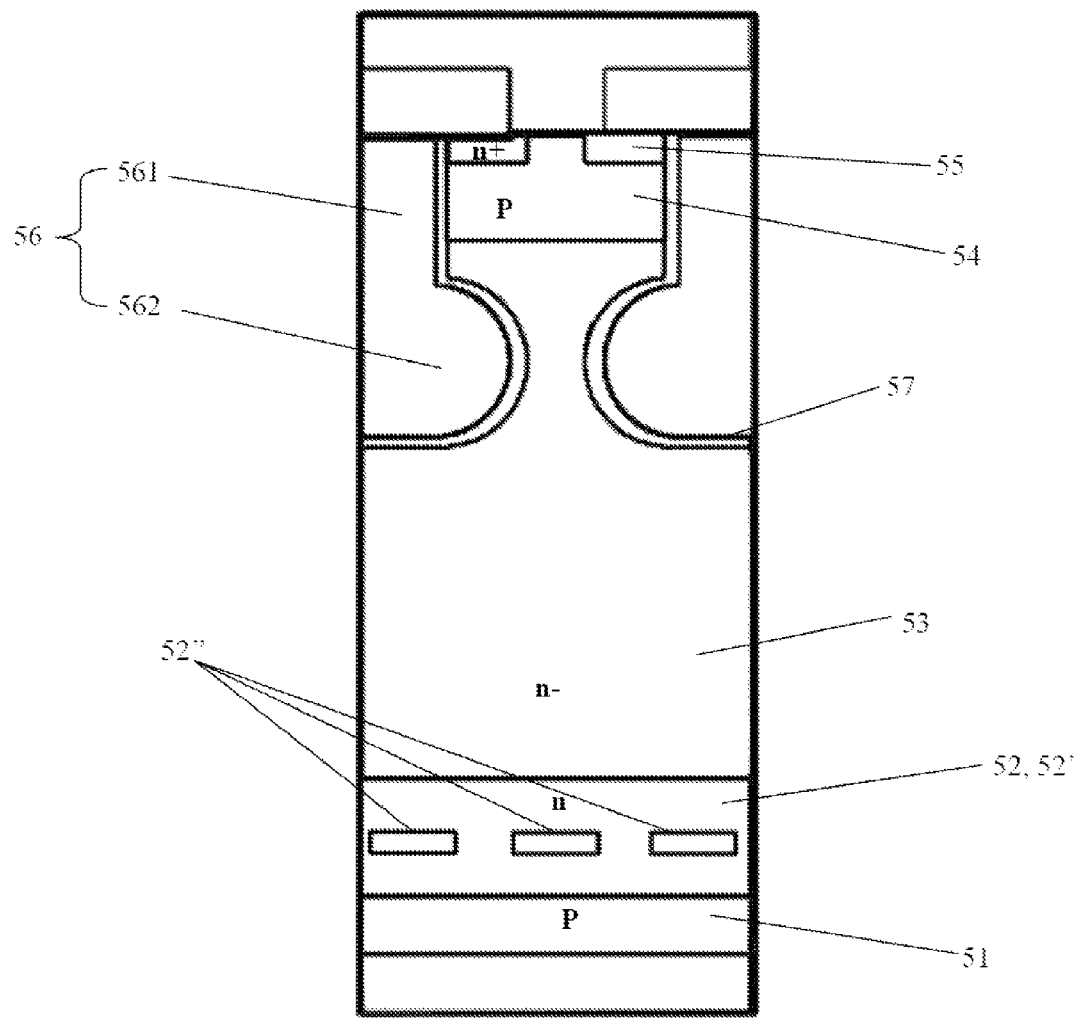
FIG. 5 is a sectional view showing an IGBT according to an embodiment.

As another or additional option for enhancing the soft turn-off behavior during turn-off of the IGBT, a plurality of buried local p-type regions can be implemented in the deep level doped region of the field stop region, as shown in FIG. 5. The reference sign 52" represents the plurality of buried local p-type regions, while other reference signs (51, 52, 52', 53, 54, 55, 56, 57, 561, 562) similar to that in FIG. 2 correspond to corresponding parts (21, 22, 22', 23, 24, 25, 26, 27, 261, 262) in FIG. 2, and the specific references thereof are not particularly described any more. Except for additionally including a plurality of buried local p-type regions 52" in the deep level doped region of the field stop region, each of the regions of the IGBT 50 and the dope type thereof, dope atoms, dope concentration etc. are similar or same with those of IGBT 20, thus the detailed description of these regions and the dope type thereof, dope atoms, dope concentration etc. are omitted.

In IGBT 50, a groove is formed on a surface of the semiconductor body and arranged at least partially at the source region 55, and wherein the groove is filled with a part of tan emitter electrode such that the emitter electrode is in contact with the source region and the base region 54. Wherein the depth of the groove is larger than or equal to the depth of pn-junction formed by the source region 55 and the base region 54. An anti-latch-up region (P+) having a doping concentration larger than that of the base region 54 is formed in the base region 54, and the anti-latch-up region (P+) has at least one first portion located below and contacting the source region 55

In IGBT 50, a lower gate 562 is arranged below an upper gate 561 in a vertical direction of the insulated gate bipolar transistor 50 and wherein the width of the lower gate 562 is larger than the width of the upper gate 561 in a lateral direction of the insulated gate bipolar transistor 50. The width of the upper gate 561 is a uniform width along the upper gate. The gate dielectric layer 57 insulates the gate electrode 56 from at least the source region 55 and the base region 54.

At least one the buried local p-type region has a lateral extension that covers several cell pitches.

Alternatively, at least one buried region comprises a plurality of buried local p-type regions that are displaced in a lateral direction of the insulated gate bipolar transistor with respect to each other.

Alternatively, the field stop region 52 includes a deep level n type doped region 52'.

The deep level n type doped region comprises a level of at least 0.2 eV below the conduction band edge.

The deep level n type doped region 52' comprises at least one type of atoms which having deep levels in the energy band gap of silicon, wherein the deep levels in the energy band gap of silicon are at least 0.2 eV below the closest band edge of silicon. The atoms include at least one from selenium and sulphur and concentration thereof is $1.E+16\ cm^{-3}$ or more.

Preferably, a relatively high concentration of the atoms as deep level donors at least close to the pn-junction between the p-type collector region and the field stop region is expected.

Alternatively, the field stop region 52 further includes atoms with energy levels which are close to the nearest band edge of silicon The buried local p-type region may or may not be aligned to the front side structure of the insulated gate bipolar transistor.

The implementation of the plurality of buried local p-type regions in the field stop region results in a controlled injection of free charge carriers during turn-off of the IGBT. In the on-state of the IGBT, these buried local p-type regions have no significant effect on the concentration of free charge carriers, but during turn-off of the IGBT, an additional injection of free charge carriers by these buried local p-type regions to the field stop region is guaranteed by a controlled breakdown of the pn-junction of these buried local p-type regions, so as to improve the soft turn-off behavior during turn-off of the IGBT. This controlled carrier injection is in particular very effective due to the doping of the field stop region with deep donor level atoms.

In the area of the junction termination or below the gate pad or below the gate leads, these buried local p-type regions could be omitted to enhance the robustness of the IGBT device during the turn-off process by a minimum injection in these areas.

Although embodiments capable of realizing the above effects are described in the preceding content through the examples of doping a deep level doped region of an IGBT with atoms having relatively deep levels in the energy band gap of silicon or implementing a plurality of buried local p-type regions in a field stop region, the present invention is not limited to these examples.

Alternatively or additionally, at least parts of the field stop region can be formed as proton-implantation regions, viz. proton-induced n-type layers, by implanting protons. These proton-induced n-type layers have relatively small penetration depths, which is beneficial for the short-circuit robustness of the IGBT device. The proton-implantation results in a controlled generation of donors in combination with an annealing step of the IGBT device performed at temperatures between 250° C. and 420° C. These processes can be performed after performing the high-temperature process steps required for the fabrication of the IGBT device and in particular after thinning the wafer from the back side.

Alternatively, the concentration of the backside emitter (collector region) of the IGBT device can also be additionally or alternatively implemented as lateral variation to enhance the soft turn-off behavior during turn-off of the IGBT with a small mesa-structure.

The implementation of an n-type field stop layer with deep donor levels and additionally or alternatively with buried local p-type layers in the IGBT with a small mesa-structure guarantees low power losses during turn-off of the IGBT device at high temperatures in combination with a soft turn-off behavior over the whole temperature range. Furthermore, an n-type doping is created within such a field stop region of the IGBT device by proton-irradiation. In addition, backside p-emitters with a controlled lateral variation of the emitter and the injection efficiency are realized.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An insulated gate bipolar transistor, comprising a semiconductor body including:
   a first base region having a second conductivity type;
   a source region having a first conductivity type different from the second conductivity type and forming a first pn-junction with the first base region;
   a drift region having the first conductivity type and forming a second pn-junction with the first base region;
   a collector region having the second conductivity type;
   at least one trench filled with a gate electrode and having a first trench portion of a first width and a second trench portion of a second width, the second width being different from the first width; and
   a field stop region having the first conductivity type and located between the drift region and the collector region,
   wherein the field stop region comprises:
      a first continuous deep level doped region of the first conductivity type having a first deep level atom doping concentration; and
      a second continuous deep level doped region of the first conductivity type closer to a third pn-junction between the collector region and the field stop region than the first continuous deep level doped region and having a second deep level atom doping concentration, wherein the first continuous deep level doped region directly adjoins the second continuous deep level doped region along an entire length of the first continuous deep level doped region, wherein the second deep level atom doping concentration is larger than the first deep level atom doping concentration, wherein the semiconductor body comprises an energy band gap with a deep energy level that is at least 0.2 eV below a conduction band edge of the energy band gap wherein the first and second continuous deep level doped regions are each doped with dopant atoms having energy levels that are in the deep energy level of the energy band gap; and wherein the dopant atoms of the first continuous deep level doped region are of a first element, and the dopant atoms of the second continuous deep level doped region are of a second element that is different from the first element.

2. The insulated gate bipolar transistor of claim 1, wherein the field stop region includes a proton implantation region.

3. The insulated gate bipolar transistor of claim 1, wherein the first continuous deep level doped region comprises selenium atoms and the second continuous deep level doped region comprises sulphur atoms.

4. The insulated gate bipolar transistor of claim 1, further comprising:
    a groove formed on a surface of the semiconductor body and arranged at least partially at the source region, and the groove being tilled with a part of an emitter electrode such that the emitter electrode is in contact with the source region and the first base region.

5. The insulated gate bipolar transistor of claim 4, wherein a depth of the groove is larger than or equal to a depth of the first pn-junction formed by the source region and the first base region.

6. The insulated gate bipolar transistor of claim 1, wherein the second trench portion is arranged below the first trench portion in a vertical direction of the insulated gate bipolar transistor and the second width is larger than the first width in a lateral direction of the insulated gate bipolar transistor.

7. The insulated gate bipolar transistor of claim 1, wherein the first width of the first trench portion is a uniform width along the first trench portion.

8. The insulated gate bipolar transistor of claim 1, wherein the at least one trench comprises an insulation electrically insulating the gate electrode from at least the source region and the first base region.

9. An insulated gate bipolar transistor, comprising a semiconductor body including:
    a first base region having a second conductivity type;
    a source region having a first conductivity type different from the second conductivity type and forming a first pn-junction with the first base region;
    a drift region having the first conductivity type and forming a second pn-junction with the first base region;
    a collector region having the second conductivity type;
    at least one trench filled with a gate electrode and having a first trench portion of a first width and a second trench portion of a second width, the second width being different from the first width; and
    a field stop region having the first conductivity type and located between the drift region and the collector region,
    wherein the field stop region comprises:
        a deep level sulfur-doped region having a first deep level atom doping concentration; and
        a deep level selenium-doped region closer to a third pn-junction between the collector region and the field stop region than the deep level sulfur-doped region and having a second deep level atom doping concentration,
    wherein the deep level sulfur-doped region directly adjoins the deep level selenium-doped region,
    wherein the second deep level atom doping concentration is larger than the first deep level atom doping concentration.

\* \* \* \* \*